United States Patent
Pal et al.

(10) Patent No.: US 10,433,071 B2
(45) Date of Patent: Oct. 1, 2019

(54) MICROPHONE WITH HYDROPHOBIC INGRESS PROTECTION

(71) Applicant: Knowles Electronics, LLC, Itasca, IL (US)

(72) Inventors: Sagnik Pal, Schaumburg, IL (US); Sung Bok Lee, Chicago, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/063,218

(22) PCT Filed: Dec. 1, 2016

(86) PCT No.: PCT/US2016/064354
§ 371 (c)(1),
(2) Date: Jun. 15, 2018

(87) PCT Pub. No.: WO2017/105851
PCT Pub. Date: Jun. 22, 2017

(65) Prior Publication Data
US 2018/0376254 A1    Dec. 27, 2018

Related U.S. Application Data

(60) Provisional application No. 62/269,186, filed on Dec. 18, 2015.

(51) Int. Cl.
*H04R 19/00*    (2006.01)
*H04R 19/04*    (2006.01)
(Continued)

(52) U.S. Cl.
CPC ............... *H04R 19/04* (2013.01); *B32B 3/30* (2013.01); *B81B 3/00* (2013.01); *B81B 7/0064* (2013.01);
(Continued)

(58) Field of Classification Search
CPC .... H04R 25/654; H04R 19/04; H04R 19/005; H04R 1/02; H04R 2201/003
See application file for complete search history.

(56) References Cited

U.S. PATENT DOCUMENTS 7,190,038 B2    3/2007    Dehe et al.
7,473,572 B2    1/2009    Dehe et al.
(Continued)

OTHER PUBLICATIONS

International Search Report and Written Opinion, PCT/US2016/064354, Knowles Electronics, LLC, 7 pages (dated Feb. 17, 2017).

*Primary Examiner* — Matthew A Eason
(74) *Attorney, Agent, or Firm* — Foley & Lardner LLP

(57) ABSTRACT

A microphone includes a base with a port extending therethrough, and a microelectromechanical system (MEMS) device coupled to the base. The MEMS device includes a diaphragm, a back plate, and a substrate. The substrate forms a back-hole. A capillary structure is disposed in the back-hole of the substrate, the cover, adjacent to the MEMS, or combinations thereof. The capillary structure includes a plurality of capillaries extending through the capillary structure. The capillary structure may have at least one hydrophobic surface and is configured to inhibit contaminants from outside the microphone from reaching the diaphragm via the port. In some embodiments, the capillary structure may protect against EMI.

15 Claims, 7 Drawing Sheets

(51) Int. Cl.
    *B32B 3/30*      (2006.01)
    *B81B 3/00*      (2006.01)
    *H04R 31/00*     (2006.01)
    *B81B 7/00*      (2006.01)
    *H04R 1/04*      (2006.01)

(52) U.S. Cl.
    CPC .............. *H04R 1/04* (2013.01); *H04R 31/006* (2013.01); *H04R 2201/003* (2013.01); *H04R 2499/11* (2013.01)

(56) References Cited

U.S. PATENT DOCUMENTS

| | | | |
|---|---|---|---|
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 9,497,529 B2 * | 11/2016 | Jeziorek | H04R 1/086 |
| 9,584,889 B2 * | 2/2017 | Escher-Poeppel | H04R 1/021 |
| 9,794,661 B2 * | 10/2017 | Watson | H04R 1/023 |
| 10,167,188 B2 * | 1/2019 | Agashe | B81B 7/0038 |
| 2005/0207605 A1 | 9/2005 | Dehe et al. | |
| 2007/0278501 A1 | 12/2007 | MacPherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0067659 A1 * | 3/2009 | Wang | H04R 19/005 381/355 |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2010/0322452 A1 * | 12/2010 | Ladabaum | H04R 25/656 381/375 |
| 2011/0013787 A1 | 1/2011 | Chang | |
| 2011/0075875 A1 | 3/2011 | Wu et al. | |
| 2012/0237073 A1 * | 9/2012 | Goida | H04R 1/02 381/361 |
| 2014/0044297 A1 * | 2/2014 | Loeppert | H04R 1/04 381/355 |
| 2014/0299948 A1 * | 10/2014 | Wang | H04R 19/005 257/416 |
| 2014/0307909 A1 * | 10/2014 | Yang | H04R 19/005 381/369 |
| 2015/0078603 A1 * | 3/2015 | van Halteren | H04R 25/654 381/328 |
| 2016/0030246 A1 * | 2/2016 | Henry | A61F 11/08 381/72 |

* cited by examiner

MICROPHONE WITH HYDROPHOBIC INGRESS PROTECTION

CROSS-REFERENCE TO RELATED APPLICATIONS

This application is a National Stage Application of PCT/US2016/064354, filed Dec. 1, 2016, which claims the benefit of and priority to U.S. Provisional Patent Application No. 62/269,186, filed Dec. 18, 2015, the entire contents of which are incorporated herein by reference.

TECHNICAL FIELD

This application relates to moisture inhibition, ingress protection, and electromagnetic interference (EMI) protection in a microelectromechanical system (MEMS) device. More specifically, this application relates to use of a capillary structure with hydrophobic properties in a MEMS device.

BACKGROUND

Different types of acoustic devices have been used through the years. One type of device is a microphone. In a microelectromechanical system (MEMS) microphone, a MEMS device includes at least one diaphragm and at least one back plate. The MEMS device is supported by a substrate and enclosed by a housing (e.g., a cup or cover with walls). A port may extend through the substrate (for a bottom port device) or through the top of the housing (for a top port device). In any case, sound energy traverses through the port, moves the diaphragm and creates a changing potential of the back plate, which creates an electrical signal. Microphones are deployed in various types of devices such as personal computers or cellular phones.

Moisture, dust, and other particles may travel through the port opening and contact the MEMS device. Particles as small as a few microns can interfere with microphone performance, especially at high sound-pressure-levels.

Some ingress protection practices have been used to prevent particles from traversing through the port and contacting the MEMS device. For instance, porous membranes made from poly-tetra-fluoro-ethylene (PTFE) or ultrahigh-molecular-weight-polyethylene (UHMWPE) may be provided near a port. Such membranes have several drawbacks. For example, the manufacture and installation of such membranes add additional steps during assembly of the microphone. Furthermore, the acoustic characteristics of such membranes often cause undesirable noise or otherwise degrade device performance. Vibration of a membrane may also produce unwanted signals within the microphone. Additionally, the membrane microstructure may not be optimal for specific applications. These and other drawbacks have resulted in some user dissatisfaction with previous approaches.

BRIEF DESCRIPTION OF THE DRAWINGS

For a more complete understanding of the disclosure, reference should be made to the following detailed description and accompanying drawings wherein.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

The present approaches provide for moisture inhibition and ingress protection. More specifically, the approaches provided herein include a capillary structure positioned in a microphone so as to prevent moisture and solid particle from impairing or damaging the MEMS device. The capillary structures contemplated herein preferably have hydrophobic properties. As used herein, "hydrophobic" refers to the tendency to repel water. The present approaches further may provide electromagnetic interference (EMI) protection in a MEMS device, and may further improve MEMS robustness to airburst events. Providing the capillary structures contemplated herein also allows for various design configurations of microphones and MEMS devices, such as increased port diameters and reduced substrate thicknesses.

Figure 1:
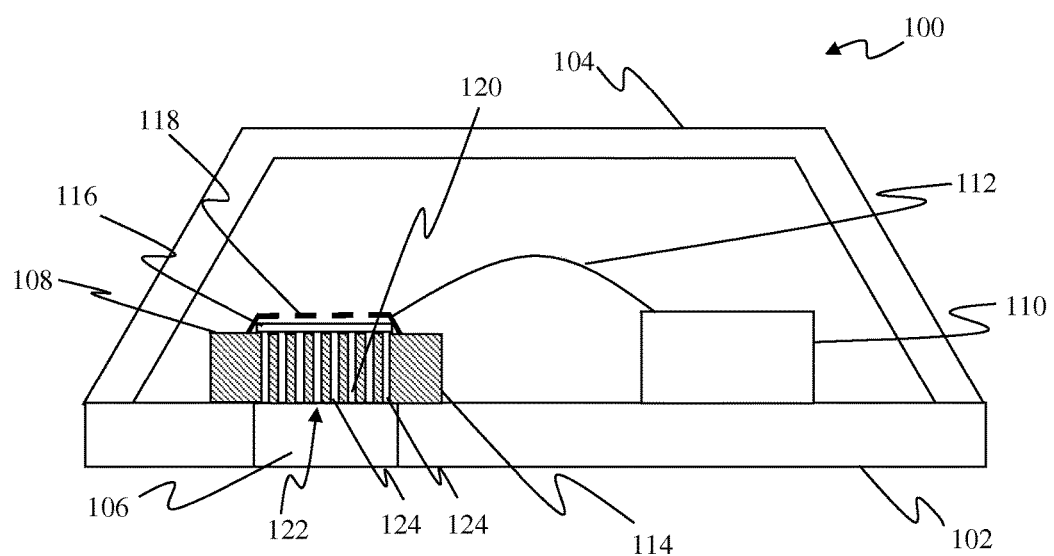
FIG. 1 comprises a cross sectional view of a bottom port microphone according to various embodiments of the present invention.

Referring now to FIG. 1, a bottom port microphone 100 includes a base 102 (e.g., a printed circuit board) coupled to a cover 104. The cover 104 may be constructed of any suitable material such as a metal. A microphone port 106 is disposed through the base 102 to permit sound to enter into the microphone 100. Coupled to the base 102 are a microelectromechanical system (MEMS) device 108 and a processing device 110 connected to the MEMS device 108 via a wire 112. The processing device 110 may be a variety of different processing devices and in one aspect may be an electronic integrated circuit that provides amplification functions for the signal obtained by the MEMS device 108.

The MEMS device 108 includes a substrate 114 that supports a diaphragm 116 and a back plate 118. In a preferred approach, the substrate 114 is a silicon substrate. Other substrate materials are possible. The substrate 114 forms a back-hole 120 that permits sound passing through the microphone port 106 to enter the MEMS device 108. In operation, sound entering the MEMS device 108 moves the diaphragm 116, which in turn generates an electrical current or voltage representative of the sound. The electrical current or voltage is transmitted to the processing device 110 for further processing.

In the example of FIG. 1, the substrate 114 includes a capillary structure 122 that includes a plurality of capillaries 124 that form a capillary array. The capillaries 124 are defined by capillary walls that extend from a first surface of the substrate 114 to a second surface opposite the first surface. As used herein, a "capillary" is an elongated channel that provides an acoustic pathway.

In a preferred approach, the capillary structure 122 is disposed so as to completely fill the back-hole 120. More specifically, the capillary structure 122 is formed by, and integral with, the substrate 114 in the back-hole 120 of the substrate 114. As discussed in greater detail elsewhere herein, capillary structure 122 has at least one hydrophobic surface and serves to inhibit contaminants from outside the microphone 100 from reaching the diaphragm 116.

Figure 2:
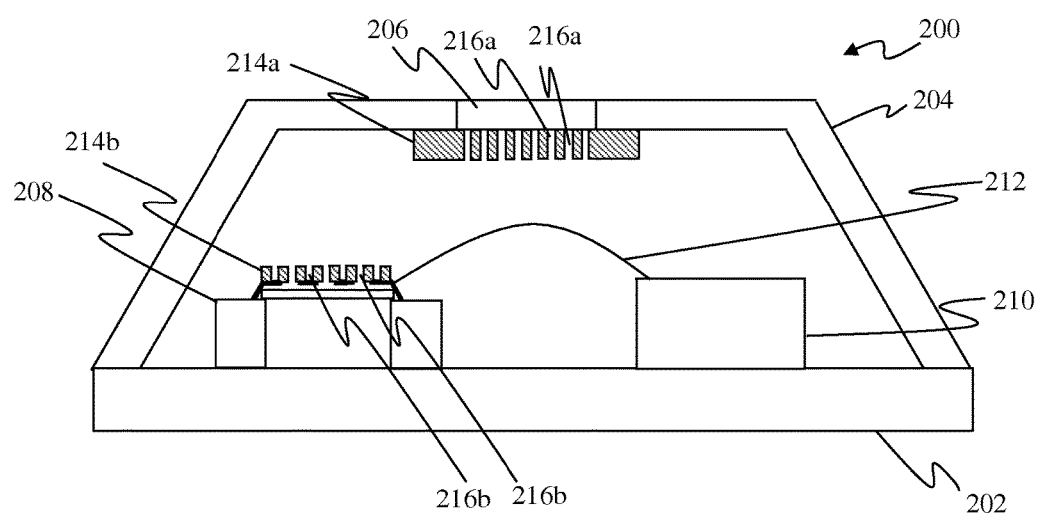
FIG. 2 comprises a cross sectional view of a top port microphone according to various embodiments of the present invention.

As shown in FIG. 2, the microphone may be a top port microphone 200. Similar to the bottom port microphone of FIG. 1, the microphone 200 includes a base 202 coupled to a cover 204. In this approach, a microphone port 206 is disposed through a top region of the cover 204 to permit sound to enter into the microphone 200. Coupled to the base 202 are a MEMS device 208 and a processing device 210 connected to the MEMS device 208 via a wire 212. In this approach, a first capillary structure 214a is disposed adjacent the microphone port 206. Alternatively, or in addition to the first capillary structure 214a, a second capillary structure 214b is disposed adjacent to the MEMS device 208. The capillary structures 214a, 214b include a plurality of capillaries 216a, 216b that form capillary arrays. The capillary structures 214a, 214b may be formed of silicon. Other examples are possible.

Figure 3:
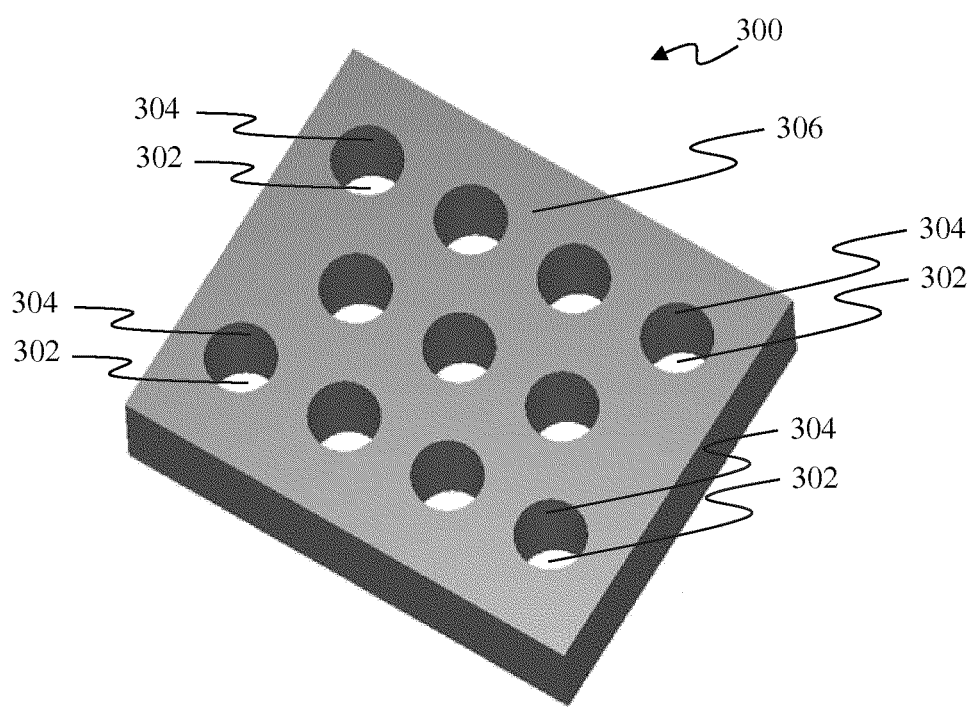
FIG. 3 comprises a perspective view of a capillary structure according to various embodiments of the present invention.

As shown in the exemplary capillary structure 300 of FIG. 3, capillaries 302 are formed by capillary walls 304 that extend through a substrate 306. The capillaries 302 may be cylindrical in shape, or may be any other suitable geometric shape. The capillaries 302 may be formed by any suitable process, including surface micromachining, bulk micromachining, self-assembly, 3D microprinting, or 3D lithography. In one approach, the capillary structure is formed from the same material as the substrate that is connected to a MEMS device (e.g, substrate 114 of FIG. 1). For example, both the substrate and the capillary structure may be silicon. In this approach, fabrication of the capillary structure 300 may be fully integrated with the fabrication of a MEMS device. In another approach, the capillary structure is formed as a discrete structure, and is integrated with the MEMS substrate. In this approach, the substrate and the capillary structure may be formed from the same material, or may be formed from different materials.

In some approaches, the capillary structure is electrically conductive. It is believed that an electrically conductive capillary structure provides improved EMI protection. This may be accomplished for example, by fabricating the capillary structure in a highly-doped silicon layer.

The capillary structure 300 is constructed such that it inhibits contaminants from outside the microphone from entering the MEMS device. In a preferred approach, at least a portion of the capillary structure 300 has hydrophobic properties. In one aspect, the substrate 306 in which the capillary structure 300 is formed is a hydrophobic material, such as polytetrafluoroethylene. In another aspect, the capillary walls 304 are coated with a hydrophobic coating. The hydrophobic coating may be a polymer, such as a parylene, and more specifically, Parylene C. The hydrophobic coating may be applied to the capillary walls 304. In one embodiment, hydrophobic coating on the capillary walls 304 may be plasma treated (e.g., $SF_6+O_2$ plasma) to further enhance hydrophobicity.

Figure 4:
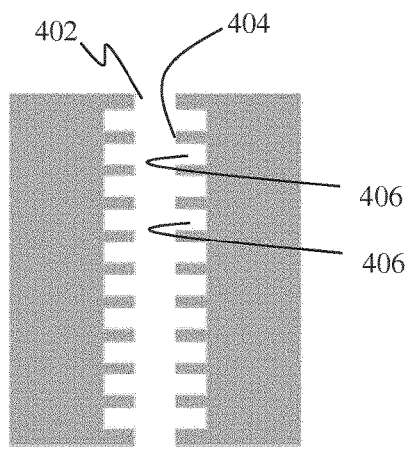
FIG. 4 comprises a cross sectional view of a capillary according to various embodiments of the present invention.
Figure 5:
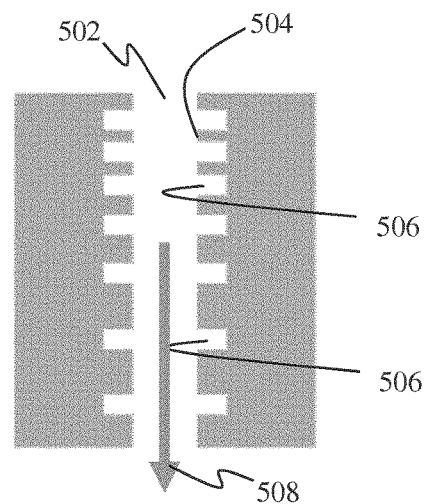
FIG. 5 comprises a cross sectional view of a capillary having a groove gradient according to various embodiments of the present invention.

In still another aspect, referring now to FIG. 4, the hydrophobicity of the capillaries 402 is increased by fabricating the capillary walls 404 to provide grooves, scallops, ridges, or any other variation on the surface of the capillary walls 404. The grooves 406 may be formed using an etching process such as deep reactive ion etching (DRIE). In one embodiment a hydrophobic coating may be applied to the capillary walls 404. Due to high hydrophobicity and/or capillary action, the grooves and/or the hydrophobic coating on the capillary walls prevent water from entering a MEMS device. Additionally, the narrow aperture of the capillaries mitigates solid ingress from entering a MEMS device. Furthermore, if the bulk material in which the capillaries are fabricated has high electrical conductivity, the structure may protect a MEMS device from EMI. The grooves 406 may be consistently spaced along the length of the capillary walls 404, as shown in FIG. 4. Alternatively, with reference to FIG. 5, the grooves 506 may be disparately spaced along the length of the capillary walls 504 of the capillaries 502. Modulating the distribution of the grooves 506 creates a hydrophobicity gradient along the length of the capillary 502 that acts to push water droplets away from a MEMS device along the length of the capillary 502, as indicated by arrow 508. Such a hydrophobicity gradient can be used to push out any water droplets that may get deposited by condensation.

Figure 6:
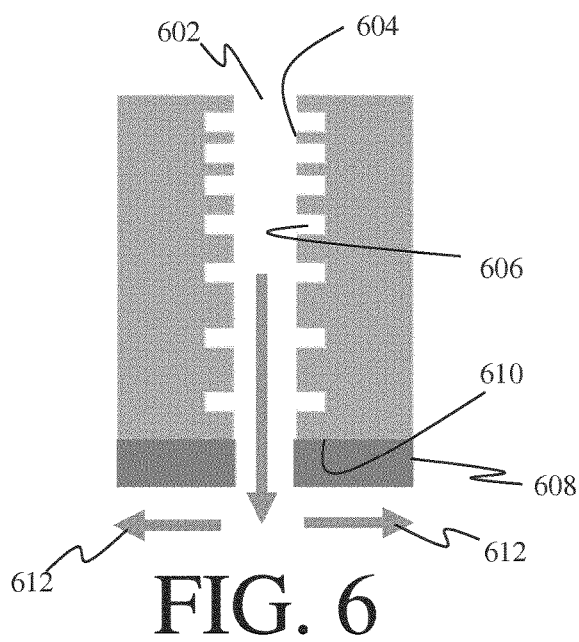
FIG. 6 comprises a cross sectional view of a capillary having a groove gradient and a hydrophilic layer according to various embodiments of the present invention.

In still another aspect, referring now to FIG. 6, a hydrophilic layer 608 may be disposed on a surface 610 adjacent the capillary 602. The hydrophilic layer 608 may be, for example, silicon-dioxide. In this approach, water droplets near the end of the capillary 602 are pulled out of the capillary 602 by the hydrophilic layer 608, as indicated by arrows 612. Moisture on the hydrophilic layer 608 may then evaporate without damaging the MEMS device.

Figure 7:
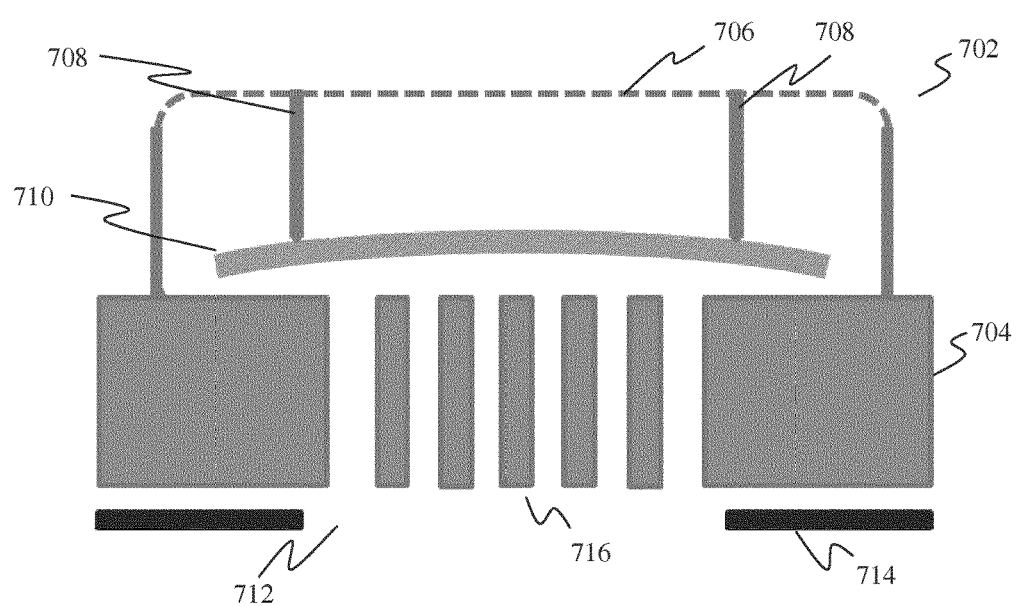
FIG. 7 comprises a cross sectional view of a MEMS device according to various embodiments of the present invention.

Referring now to FIG. 7, a MEMS device 702 includes a substrate 704, a back plate 706 supported by the substrate 704, and posts 708 supporting a diaphragm 710. The MEMS device 702 is disposed adjacent to a microphone port 712 in a microphone base 714. The substrate 704 includes a capillary structure 716 that inhibits moisture or other particles from entering the MEMS device 702. In one embodiment the substrate 704 in which the capillary structure is fabricated has high electrical conductivity which provides for increased EMI protection. Due at least in part to the heretofore discussed protections afforded by the capillary structure 716, the microphone port 712 may be significantly increased in size without significantly adding risk of damage to the MEMS device 702. For example, whereas a microphone port without ingress protection may be limited to a diameter of about 250 µm, the microphone port 712 of FIG. 7 may have a diameter of about 800 µm due to the presence of the capillary structure 716. Increasing the diameter of the microphone port has been found to reduce noise at the MEMS device.

Figure 8:
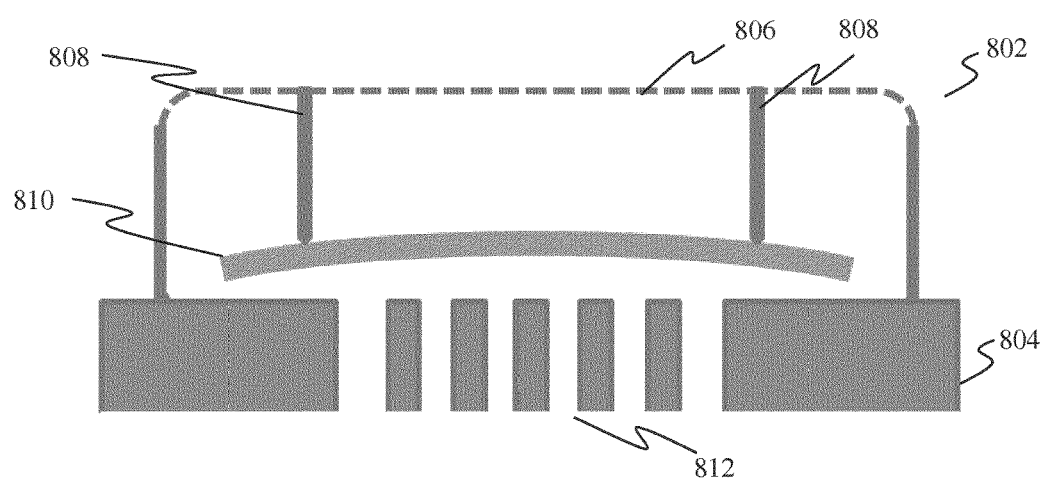
FIG. 8 comprises a cross sectional view of a MEMS device having a reduced substrate thickness according to various embodiments of the present invention.

Referring now to FIG. 8, a MEMS device 802 includes a substrate 804, a back plate 806 supported by the substrate 804, and posts 808 supporting a diaphragm 810. The substrate 804 includes a capillary structure 812, as discussed elsewhere herein. In this approach, due at least in part to the additional mechanical strength provided by the capillary structure 812, the thicknesses of both the substrate 804 and the capillary structure 812 may be significantly reduced. For example, the thickness of the substrate 804 may be reduced from about 160 µm to approximately 80 µm. This reduces the overall height of the MEMS device 802, allowing for increased flexibility in microphone design.

Figure 9:
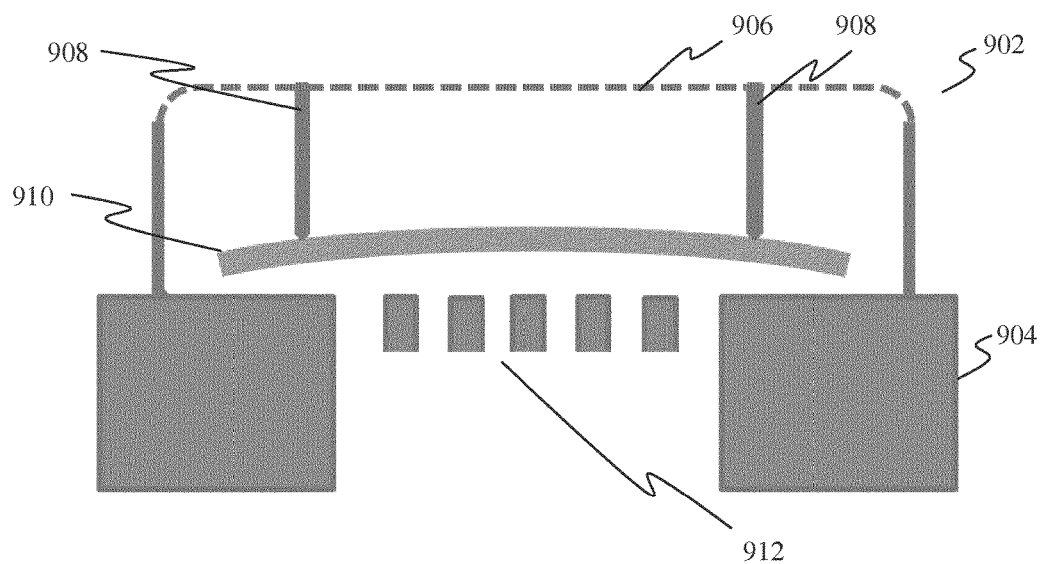
FIG. 9 comprises a cross sectional view of a MEMS device having a reduced capillary structure thickness according to various embodiments of the present invention.

Referring now to FIG. 9, a MEMS device 902 includes a substrate 904, a back plate 906 supported by the substrate 904, and posts 908 supporting a diaphragm 910. The substrate 904 includes a capillary structure 912, as discussed elsewhere herein. In this approach, the substrate 904 and the capillary structure 912 have different thicknesses. For example, the substrate 904 may have a thickness of about 160 µm, and the capillary structure 912 may have a thickness of about 30 µm. Reduced thickness of the capillary structure 912 reduces acoustic noise and improves overall signal-to-noise ratio. Thus, ingress and/or EMI protection may be achieved with minimal impact to acoustic performance.

The embodiments described herein contemplate a capillary structure that provides improved waterproofing and ingress protection in acoustic devices. These embodiments also advantageously reduce microphone assembly time and costs, reduce part-to-part variation due to improved repeatability of microfabrication techniques, provide increased design possibilities in optimizing ingress-protection, waterproofing, and acoustic properties, facilitate miniaturization, and reduce vibration as compared to conventional membrane approaches.

The embodiments may be used in wearable electronics (such as smart watches, smart glasses, smart bands, smart jewelry, or activity trackers), portable electronics (such as cellphones or tablets), underwater cameras, and microphones used in harsh environments.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A microphone, the microphone comprising:
   a base, the base having a port extending therethrough;
   a microelectromechanical system (MEMS) device coupled to the base, the MEMS device including a diaphragm, a back plate, and a substrate, the substrate forming a back-hole; and
   a capillary structure disposed in the back-hole of the substrate and integral to the substrate, the capillary structure including a plurality of capillaries extending through the capillary structure, the capillary structure configured to inhibit contaminants from outside the microphone from reaching the diaphragm via the port.

2. The microphone of claim 1, wherein the capillary structure includes at least one hydrophobic surface.

3. The microphone of claim 2, wherein the at least one hydrophobic surface is at least one capillary wall, and wherein the capillary wall includes a hydrophobic coating.

4. The microphone of claim 3, wherein the hydrophobic coating is a parylene polymer.

5. The microphone of claim 2, wherein the at least one hydrophobic surface is at least one capillary wall, and wherein the capillary wall comprises a plurality of grooves along a length of the capillary wall.

6. The microphone of claim 5, wherein the plurality of grooves are disparately spaced along the length of the capillary wall to provide a hydrophobicity gradient.

7. The microphone of claim 1, further comprising a hydrophilic layer disposed on a surface of the capillary structure.

8. The microphone of claim 1, wherein the capillary structure is disposed in substantially all of the back-hole.

9. The microphone of claim 1, wherein the capillary structure provides shielding from electromagnetic interference.

10. A microphone, the microphone comprising:
    a base, the base having a port disposed therethrough;
    a cover;
    a microelectromechanical system (MEMS) device coupled to the base, the MEMS device including a substrate forming a back-hole, a diaphragm and a back plate; and
    a capillary structure connected to the MEMS device, the capillary structure including a plurality of capillaries extending through the capillary structure, the capillary structure configured to inhibit contaminants from outside the microphone from reaching the diaphragm, wherein substantially all of the back-hole is filled with at least a portion of the capillary structure.

11. The microphone of claim 10, wherein the capillary structure covers the port and mitigates ingress.

12. The microphone of claim 10, wherein the capillary structure is formed integral to the MEMS device.

13. The microphone of claim 10, wherein the capillary structure comprises a first capillary structure connected to the MEMS device, and wherein the microphone further comprises a second capillary structure that covers the port.

14. The microphone of claim 10, wherein the capillary structure has at least one hydrophobic surface.

15. The microphone of claim 10, wherein the capillary structure provides shielding from electromagnetic interference.

* * * * *